(12) United States Patent
Togashi

(10) Patent No.: US 12,316,933 B2
(45) Date of Patent: May 27, 2025

(54) IMAGE CAPTURING APPARATUS COMPRISING COOLING DEVICE AND IMAGE SENSOR, CONTROL METHOD FOR COOLING DEVICE BASED ON SENSITIVITY OF THE IMAGE SENSOR AND STORAGE MEDIUM

(71) Applicant: CANON KABUSHIKI KAISHA, Tokyo (JP)

(72) Inventor: Go Togashi, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 116 days.

(21) Appl. No.: 18/296,426

(22) Filed: Apr. 6, 2023

(65) Prior Publication Data
US 2023/0345097 A1 Oct. 26, 2023

(30) Foreign Application Priority Data
Apr. 20, 2022 (JP) .................. 2022-069591

(51) Int. Cl.
| | |
|---|---|
| H04N 23/52 | (2023.01) |
| G03B 17/55 | (2021.01) |
| H04N 23/57 | (2023.01) |
| H04N 23/60 | (2023.01) |
| H04N 23/65 | (2023.01) |
| H04N 25/60 | (2023.01) |
| H05K 7/20 | (2006.01) |

(52) U.S. Cl.
CPC ............ *H04N 23/52* (2023.01); *G03B 17/55* (2013.01); *H04N 23/57* (2023.01); *H04N 23/60* (2023.01); *H04N 23/651* (2023.01); *H04N 25/60* (2023.01); *H05K 7/20209* (2013.01); *H05K 7/20281* (2013.01); *H05K 7/2039* (2013.01)

(58) Field of Classification Search
CPC ........ H04N 23/52; H04N 23/50; H04N 23/51; H04N 23/54; H04N 23/57; H04N 23/60; H04N 23/65; H04N 23/651; H04N 25/62; H04N 25/63; G03B 17/55; G03B 2217/007; H05K 7/20209; H05K 7/20281; H05K 7/2039
See application file for complete search history.

(56) References Cited

U.S. PATENT DOCUMENTS

| | | | |
|---|---|---|---|
| 7,755,687 B2 * | 7/2010 | Fukushima .......... | H04N 25/713 348/300 |
| 2018/0336398 A1 * | 11/2018 | Shenoy ................. | G06F 1/3206 |
| 2019/0142254 A1 * | 5/2019 | Chiba .............. | A61B 1/000095 600/109 |
| 2019/0154949 A1 * | 5/2019 | Hosoe ................ | G05D 23/1919 |

FOREIGN PATENT DOCUMENTS

| | | | | |
|---|---|---|---|---|
| JP | 2005-354258 A | | 12/2005 | |
| JP | 2006135659 A | * | 5/2006 | ............. H01L 23/34 |

* cited by examiner

*Primary Examiner* — Twyler L Haskins
*Assistant Examiner* — Akshay Trehan
(74) *Attorney, Agent, or Firm* — Cowan, Liebowitz & Latman, P.C.

(57) ABSTRACT

An image capturing apparatus includes an image sensor, a cooling device configured to cool the image capturing apparatus, a storage unit having stored therein a correspondence relationship between sensitivities of the image sensor and cooling capabilities of the cooling device, and a control unit configured to control an operation of the cooling device based on a sensitivity of the image sensor and on the correspondence relationship stored in the storage unit.

12 Claims, 2 Drawing Sheets

| ISO | AIR FLOW (Lv1 < Lv5) | COOLING OPERATION START TEMPERATURE |
|---|---|---|
| 50~300 | Lv5 | 45°C |
| 400~900 | Lv4 | 43°C |
| 1000~5000 | Lv3 | 41°C |
| 6000~9000 | Lv2 | 39°C |
| MORE THAN 10000 | Lv1 | 37°C |

IMAGE CAPTURING APPARATUS COMPRISING COOLING DEVICE AND IMAGE SENSOR, CONTROL METHOD FOR COOLING DEVICE BASED ON SENSITIVITY OF THE IMAGE SENSOR AND STORAGE MEDIUM

BACKGROUND OF THE INVENTION

Field of the Invention

The present invention relates to a cooling technique for an image capturing apparatus.

Description of the Related Art

In recent years, the advancements in the moving image shooting functions have fostered improvements in the image quality, such as 4K/8K, and the frame rate of image capturing apparatuses, and there is a tendency toward an increase in power consumption of the apparatuses. The increase in power consumption promotes an increase in the temperature inside the image capturing apparatuses, which makes it necessary to take measures so that the temperature inside the apparatuses does not exceed the insured temperatures of electronic components.

Furthermore, the increase in the temperature inside the image capturing apparatuses not only influences the operations of electronic components as mentioned above, but also influences the image quality. This is because the increase in the temperature causes an increase in dark current noise in an image sensor.

Under the foregoing circumstances, Japanese Patent Laid-Open No. 2005-354258 discloses the following technique. First, an exposure condition equivalent to the product of an exposure period and an image capturing sensitivity, as well as a temperature condition of an image sensor, is referenced. Then, the operations of cooling means are controlled based on the S/N ratio of an image signal, which can be assumed from a random noise amount that is barely dependent on the temperature and a dark current noise amount that is dependent on the temperature.

However, with the conventional technique disclosed in Japanese Patent Laid-Open No. 2005-354258, the temperature distribution is uneven on a surface of the image sensor depending on the location to be cooled. When there is unevenness in the temperature on the surface of the image sensor, the dark current noise level also becomes uneven, which consequently appears as shading in the image quality, thereby lowering the image quality.

SUMMARY OF THE INVENTION

The present invention has been made in view of the aforementioned problem, and suppresses shading that appears in an image on an image capturing apparatus that has a cooling function.

According to a first aspect of the present invention, there is provided an image capturing apparatus that includes an image sensor, the image capturing apparatus comprising: a cooling device configured to cool the image capturing apparatus; and at least one processor or circuit configured to function as a storage unit having stored therein a correspondence relationship between sensitivities of the image sensor and cooling capabilities of the cooling device; and a control unit configured to control an operation of the cooling device based on a sensitivity of the image sensor and on the correspondence relationship stored in the storage unit.

According to a second aspect of the present invention, there is provided a method of controlling an image capturing apparatus that includes an image sensor, a cooling device configured to cool the image capturing apparatus, and a storage device having stored therein a correspondence relationship between sensitivities of the image sensor and cooling capabilities of the cooling device, the method comprising: controlling an operation of the cooling device based on a sensitivity of the image sensor and on the correspondence relationship stored in the storage device.

Further features of the present invention will become apparent from the following description of exemplary embodiments with reference to the attached drawings.

DESCRIPTION OF THE EMBODIMENTS

Figure 1:
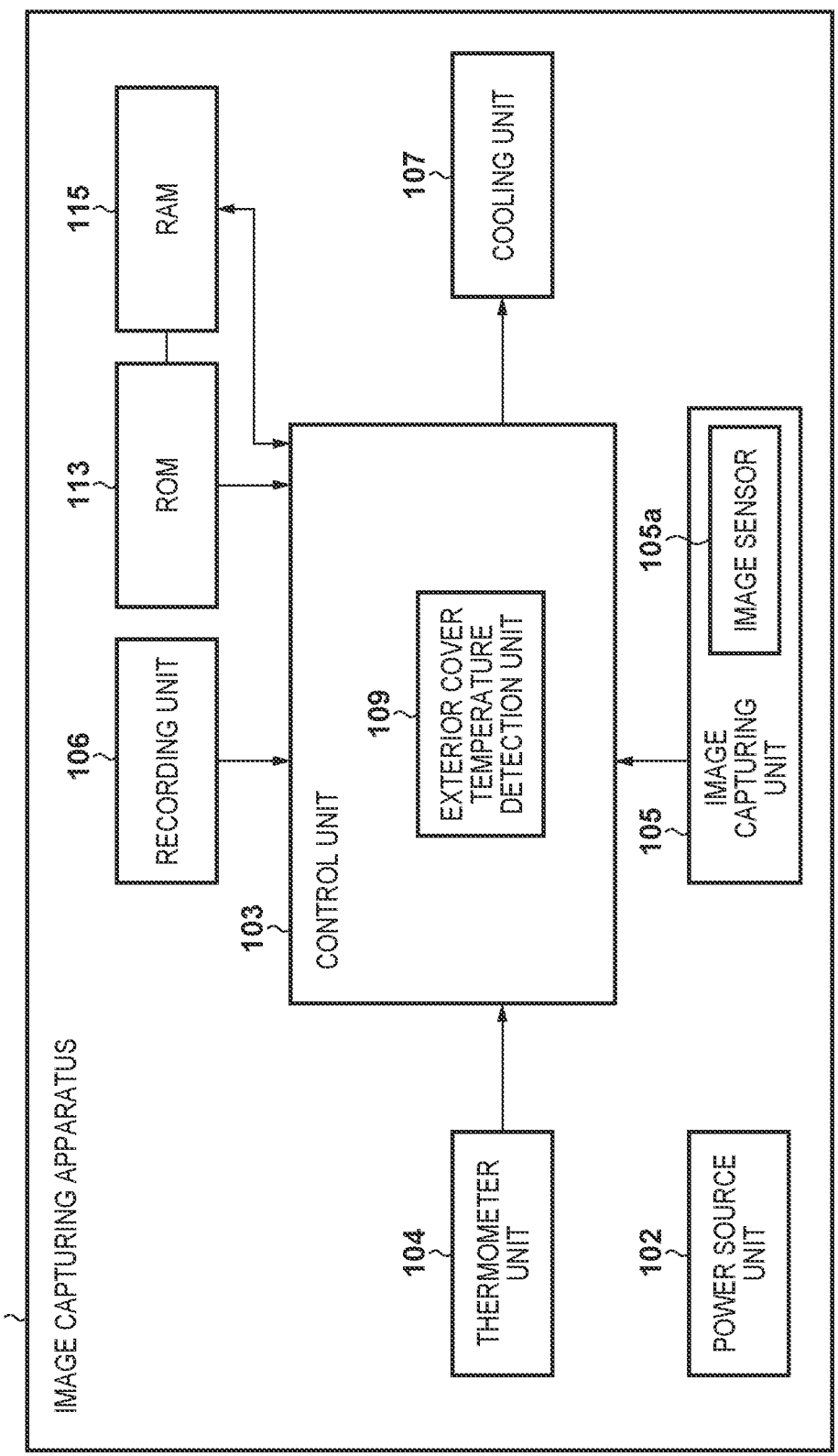
FIG. 1 is a block diagram showing a configuration of an image capturing apparatus according to an embodiment of the present invention.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

FIG. 1 is a block diagram showing a configuration of an image capturing apparatus 101 according to an embodiment of the present invention.

The image capturing apparatus 101 is configured to include a power source unit 102, a control unit 103, thermometer units 104, an image capturing unit 105, a recording unit 106, a cooling unit 107, a ROM 113, and a RAM 115.

The power source unit 102, for example, converts a voltage supplied from a supply source, such as a non-illustrated battery or AC adapter, into a desired voltage, and supplies the desired voltage to each electronic component of the image capturing apparatus 101.

The control unit 103 controls the entirety of the image capturing apparatus 101, which includes the thermometer units 104, the image capturing unit 105, the recording unit 106, the cooling unit 107, and other constituents, by deploying a control program stored in the ROM 113 to the RAM 115 and executing the control program. Furthermore, as a result of the execution of the aforementioned control program by the control unit 103, an exterior cover temperature detection unit 109 that acts as a module realized by the control program is configured inside the control unit 103.

It is sufficient for the thermometer units 104 to be capable of measuring the temperature inside the image capturing apparatus 101; for example, thermistors or digital thermometers are used thereas.

The image capturing unit 105 includes an image sensor 105a composed of a CMOS sensor, a CCD, or the like, and transmits obtained video information to the control unit 103.

Furthermore, in the present embodiment, information of an optical black unit (hereinafter referred to as an OB unit) of the image sensor 105a is transmitted to the control unit 103. The OB unit is a portion that is mechanically masked (blocked from light) so that a peripheral portion of the image sensor 105a does not receive light. In this OB unit, as light is always blocked, dark current noise can always be obtained on a per-pixel basis.

The recording unit 106 is a nonvolatile memory that can hold information even if a power source is not supplied thereto; in the present embodiment, information related to control on the cooling unit 107 is recorded therein. The details of the recording unit 106 will be described later.

It is sufficient for the cooling unit 107 to be means capable of cooling the image capturing apparatus 101; for example, an air blower, a circulator that circulates liquid for cooling, a Peltier device, or the like is used thereas. Furthermore, the cooling capability can be changed via the amount of current applied to the air blower, circulator, or Peltier device; the cooling capability is changed by an instruction from the control unit 103. In addition, although the cooling unit 107 is described as being built in the image capturing apparatus 101 in the present embodiment, the cooling unit 107 may be configured to be externally mountable separately from the image capturing apparatus 101.

It is sufficient for the exterior cover temperature detection unit 109 to be capable of detecting the temperature at a predetermined position on an exterior cover of the image capturing apparatus 101; for example, the thermometer units 104 may be placed on the inner side of the exterior cover. Furthermore, temperature information of the exterior cover may be obtained from an external apparatus that is separate from the image capturing apparatus 101.

Next, cooling control in the image capturing apparatus according to the present embodiment will be described with reference to FIG. 2 and FIG. 3.

Figures 2, 3:
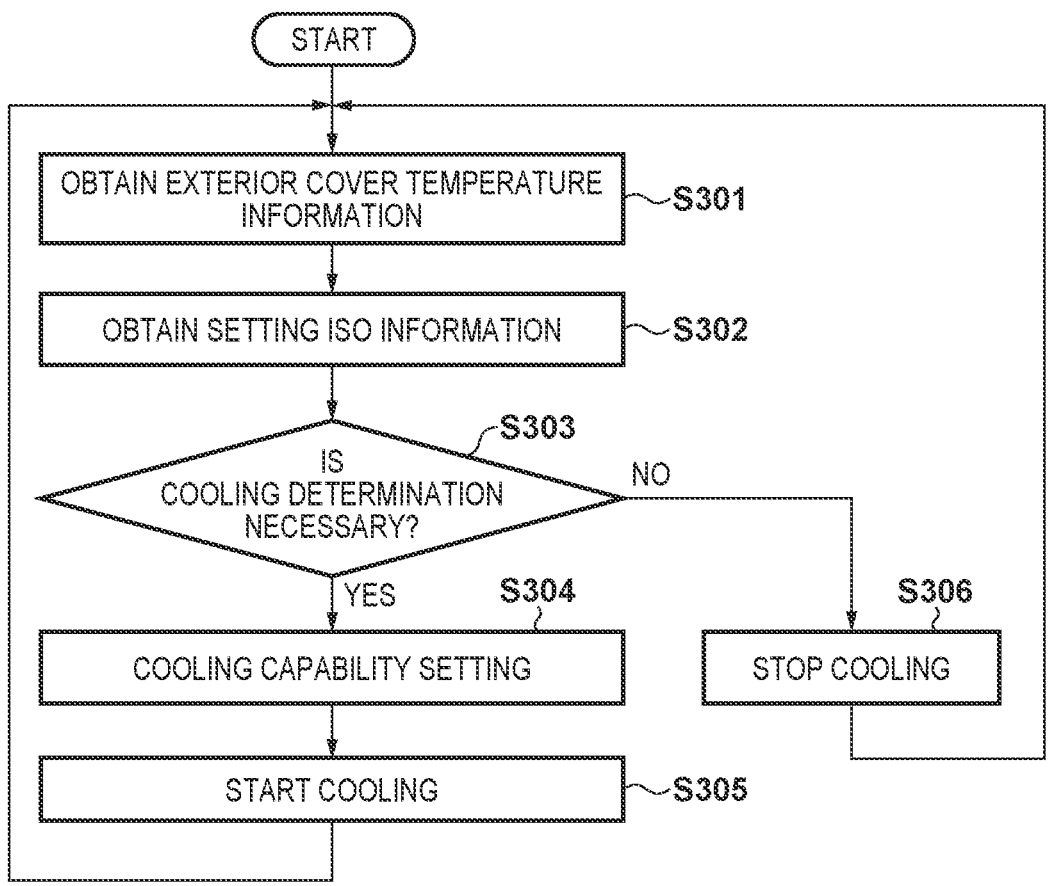
FIG. 2 is a drawing showing information related to control on a cooling unit, which is recorded in a recording unit.
FIG. 3 is a flowchart showing the operations of cooling control according to one embodiment.

FIG. 2 is a diagram showing the information related to control on the cooling unit 107, which is recorded in the recording unit 106.

In the recording unit 106, a correspondence relationship between the ISO sensitivities set on the image capturing unit 105 and the cooling capabilities of the cooling unit 107 is recorded. Note that the present embodiment will be described below under the assumption that the air blower is used as the cooling unit 107.

More specifically, in the recording unit 106, the cooling capabilities up to "Lv1", which corresponds to ISO 10000 or higher, are recorded; for example, the cooling capability "Lv5" and the cooling capability "Lv4" are recorded in correspondence with sensitivities of ISO 50 to ISO 300 and ISO 400 to 900 set on the image capturing unit 105, respectively. With regard to the settings, the cooling capability is the weakest at Lv1, and becomes stronger as it reaches Lv2, LV3, and so forth. However, the settings of ISO ranges and cooling capabilities are examples, and no limitation is intended by these settings.

In the recording unit 106, the temperatures at which the operations of the cooling unit 107 are started (the temperatures at which cooling is started) are further recorded in correspondence with the sensitivities set on the image capturing unit 105. The temperatures at which the operations are started are based on the temperature detected by the exterior cover temperature detection unit 109 among the thermometer units 104.

FIG. 3 is a flowchart showing the operations of cooling control according to the present embodiment. The operation of this flowchart is realized by the control unit 103 deploying the control program stored in the ROM 113 to the RAM 115 and executing the control program.

First, when the image capturing apparatus 101 has been activated by a user operation, the control unit 103 obtains exterior cover temperature information of the thermometer units 104 using the exterior cover temperature detection unit 109 in step S301.

In step S302, the control unit 103 obtains information of the ISO sensitivity of the image capturing unit 105.

In step S303, the control unit 103 determines whether to cause the cooling unit 107 to start operating based on the exterior cover temperature information and the ISO sensitivity information obtained in steps S301 and S302, and on control information of the cooling unit 107 recorded in the recording unit 106 shown in FIG. 2. For example, in a case where the exterior cover temperature is 39.5° C. and ISO 400 has been set, it is determined that the cooling unit 107 is not to be placed in operation; on the other hand, in the case of ISO 6000, it is determined that the cooling unit 107 is to be placed in operation.

In a case where the control unit 103 has determined that the cooling unit 107 is to be placed in operation in step S303, processing proceeds to step S304; in a case where it has determined that the cooling unit 107 is not to be placed in operation, processing proceeds to step S306.

In step S306, in a case where the cooling unit 107 is in operation, its operation is stopped by the control unit 103. In a case where the cooling unit 107 is not in operation, processing returns to step S301 by skipping step S306. Then, the control unit 103 repeats the detection of the exterior cover temperature, the obtainment of the ISO sensitivity information, and the determination of whether to place the cooling unit 107 in operation in regular cycles.

In step S304, the control unit 103 sets the cooling capability of the cooling unit 107 based on the control information of the cooling unit 107 recorded in the recording unit 106 shown in FIG. 2. For example, in a case where the exterior cover temperature is 44° C. and ISO 400 has been set, the cooling capability of the cooling unit 107 is set at "Lv4".

In step S305, the control unit 103 instructs the cooling unit 107 to start operating. Once a cooling operation has been started, the control unit 103 causes processing to return to step S301, and repeats the detection of the exterior cover temperature, the obtainment of the ISO sensitivity information, and the determination of whether the operations of the cooling unit 107 are to be continued, changed or stopped in regular cycles.

Note that although the operations of the cooling unit 107 are controlled based on the exterior cover temperature information in the description of the present embodiment, they may be controlled based on the temperature of a device, such as an electronic component, inside the image capturing apparatus 101.

As described above, according to the present embodiment, the cooling capability of the cooling unit 107 is changed in accordance with the sensitivity set on the image capturing unit 105; in this way, the image capturing apparatus 101 can be cooled effectively without causing the occurrence of shading in the image capturing unit 105 attributed to cooling. Furthermore, as the temperature range in which the cooling unit 107 is placed in operation is changed in accordance with the sensitivity of the image capturing unit 105, unnecessary consumption of electric power can be prevented.

OTHER EMBODIMENTS

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-069591, filed Apr. 20, 2022, which is hereby incorporated by reference herein in its entirety.

What is claimed is:

1. An image capturing apparatus comprising:
an image sensor;
a cooling device configured to cool the image capturing apparatus;
a temperature detector configured to detect a temperature at a predetermined position on the image capturing apparatus;
a storage device configured to store a correspondence relationship between sensitivities of the image sensor and cooling start temperatures for starting an operation of the cooling device; and
a controller configured to start the operation of the cooling device based on the sensitivity of the image sensor, the cooling start temperature stored in the storage device, and the detection result of the temperature detection device,
wherein the cooling start temperature, at which the operation of the cooling device is started, varies based on the sensitivity of the image sensor.

2. The image capturing apparatus according to claim 1, wherein
the cooling start temperature is set to increase as a sensitivity of the image sensor decreases.

3. The image capturing apparatus according to claim 1, wherein
the cooling device is a cooling device that uses a Peltier device.

4. The image capturing apparatus according to claim 1, wherein
the cooling device is a cooling device that uses an air blower.

5. The image capturing apparatus according to claim 1, wherein
the cooling device performs cooling by circulating liquid.

6. The image capturing apparatus according to claim 1, wherein
sensitivities of the image sensor are divided into a plurality of sensitivity ranges, and each sensitivity range of the plurality of sensitivity ranges corresponds to a predetermined cooling start temperature.

7. An image capturing apparatus comprising:
an image sensor;
a cooling device configured to cool the image capturing apparatus; and
a storage device having stored therein a correspondence relationship between sensitivities of the image sensor and cooling capabilities of the cooling device; and
a controller configured to control an operation of the cooling device based on a sensitivity of the image sensor and on the correspondence relationship stored in the storage device, wherein
the cooling device is a cooling device that performs cooling by circulating liquid.

8. The image capturing apparatus according to claim 7, wherein
the correspondence relationship is set so that a cooling capability of the cooling device increases as a sensitivity of the image sensor decreases.

9. The image capturing apparatus according to claim 7, further comprising
an exterior cover temperature detector configured to detect an exterior cover temperature at a predetermined position on the image capturing apparatus, wherein the controller controls the operation of the cooling device further based on an exterior cover temperature detected by the exterior cover temperature detector.

10. The image capturing apparatus according to claim 9, wherein
the storage device stores a cooling start temperature, at which the operation of the cooling device is started, in correspondence with the sensitivities of the image sensor, and the controller starts the operation of the cooling device based on the exterior cover temperature and on the cooling start temperature stored in the storage device.

11. A method of controlling an image capturing apparatus that includes an image sensor, a cooling device configured to cool the image capturing apparatus, a temperature detector configured to detect a temperature at a predetermined position on the image capturing apparatus, and a storage device configured to store a correspondence relationship between sensitivities of the image sensor and cooling start temperatures for starting an operation of the cooling device, the method comprising:
controlling to start the operation of the cooling device based on the sensitivity of the image sensor, the cooling start temperature stored in the storage device, and the detection result of the temperature detection device,
wherein the cooling start temperature, at which the operation of the cooling device is started, varies based on the sensitivity of the image sensor.

12. A non-transitory computer-readable storage medium having stored therein a program for causing a computer to execute a method of controlling an image capturing apparatus that includes an image sensor, a cooling device configured to cool the image capturing apparatus, a temperature detector configured to detect a temperature at a predetermined position on the image capturing apparatus, and a storage device configured to store a correspondence relationship between sensitivities of the image sensor and cooling start temperatures for starting an operation of the cooling device, the method comprising:

controlling to start the operation of the cooling device based on the sensitivity of the image sensor, the cooling start temperature stored in the storage device, and the detection result of the temperature detection device, wherein the cooling start temperature, at which the operation of the cooling device is started, varies based on the sensitivity of the image sensor.

* * * * *